US 6,259,638 B1

(12) United States Patent
Kim (10) Patent No.: US 6,259,638 B1
(45) Date of Patent: Jul. 10, 2001

(54) INTEGRATED CIRCUIT MEMORY DEVICES HAVING AN IMPROVED WAFER BURN-IN TEST CAPABILITY THROUGH INDEPENDENT OPERATIONAL CONTROL OF A MEMORY CELL ARRAY AND RELATED METHODS OF TESTING SAME

(75) Inventor: Jong-ryeul Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/391,243

(22) Filed: Sep. 7, 1999

(30) Foreign Application Priority Data

Sep. 8, 1998 (KR) .................................... 98-36995

(51) Int. Cl.$^7$ ...................................... G11C 7/00
(52) U.S. Cl. ...................... 365/201; 365/230.06
(58) Field of Search .............................. 365/230.06, 201, 365/189.01, 185.04

(56) References Cited

U.S. PATENT DOCUMENTS

| 4,335,449 | * | 6/1982 | Nokubo | 365/182 |
|---|---|---|---|---|
| 4,763,302 | * | 8/1988 | Yamada | 365/189.01 |
| 5,241,500 | * | 8/1993 | Barth, Jr. et al. | 365/201 |
| 5,268,863 | * | 12/1993 | Bader et al. | 365/203 |
| 5,325,330 | * | 6/1994 | Morgan | 365/203 |
| 5,379,265 | * | 1/1995 | Yamada et al. | 365/203 |
| 5,424,990 | * | 6/1995 | Ohsawa | 365/201 |
| 5,432,744 | * | 7/1995 | Nagata | 365/230.06 |
| 5,471,429 | * | 11/1995 | Lee et al. | 365/201 |
| 5,495,448 | * | 2/1996 | Sachdev | 365/230.06 |
| 5,544,123 | * | 8/1996 | Hoshi et al. | 365/230.06 |
| 5,546,345 | * | 8/1996 | Wada et al. | 365/203 |
| 5,583,814 | * | 12/1996 | Iwamura et al. | 365/189.01 |
| 5,638,331 | * | 6/1997 | Cha et al. | 365/230.06 |
| 5,903,511 | * | 5/1999 | Gillingham | 365/230.06 |

* cited by examiner

Primary Examiner—Tan T. Nguyen
(74) Attorney, Agent, or Firm—Myers Bigel Sibley & Sajovec (57) ABSTRACT

Integrated circuit memory devices and methods of testing same use a word line selection unit generate address signals to selectively activate word lines of a memory cell array in response to a plurality of first input signals. In addition, a write and read control unit independently generates an operation control signal in response to a second input signal that is used to place the memory cell array into a "read mode" or a "write mode." Because the operation control signal is generated independent from the word line selection unit, a wafer burn-in test write operation can be performed on all memory cells of the memory cell array. Moreover, the independence of the write and read control unit can allow the memory cell array to be enabled for a read operation before initiating the read operation through the word line selection unit thereby avoiding any potential race condition.

29 Claims, 10 Drawing Sheets

INTEGRATED CIRCUIT MEMORY DEVICES HAVING AN IMPROVED WAFER BURN-IN TEST CAPABILITY THROUGH INDEPENDENT OPERATIONAL CONTROL OF A MEMORY CELL ARRAY AND RELATED METHODS OF TESTING SAME

CROSS REFERENCE TO RELATED APPLICATION

This application claims the benefit of Korean Patent Application No. 98-36995, filed Sep. 8, 1998, the disclosure of which is hereby incorporated herein by reference.

FIELD OF THE INVENTION

The present invention relates generally to the field of integrated circuit memory devices, and, more particularly, to integrated circuit memory devices that have a wafer burn-in test capability.

BACKGROUND OF THE INVENTION

A wafer burn-in test methodology can be used to verify the reliability of an integrated circuit memory device. In accordance with a wafer burn-in test, a voltage higher than a normal operational voltage for the integrated circuit memory device is applied at a high temperature (i.e., stress is applied) to test for the presence of various defects that may be exhibited while the integrated circuit memory device is still in the wafer state. Thus, an integrated circuit memory device may include test circuits for performing wafer burn-in tests.

In particular, a conventional wafer burn-in test may involve the selection of odd-numbered word lines or even-numbered word lines and then the application of stress to write data into the memory cells. Alternatively, a conventional wafer burn-in test may involve the selection of word lines corresponding to true cells or complementary cells and then the application of stress to write data into these memory cells. A conventional wafer burn-in test may also include a read operation in which all word lines are selected and stress is applied to read data from the memory cells.

Figure 1:
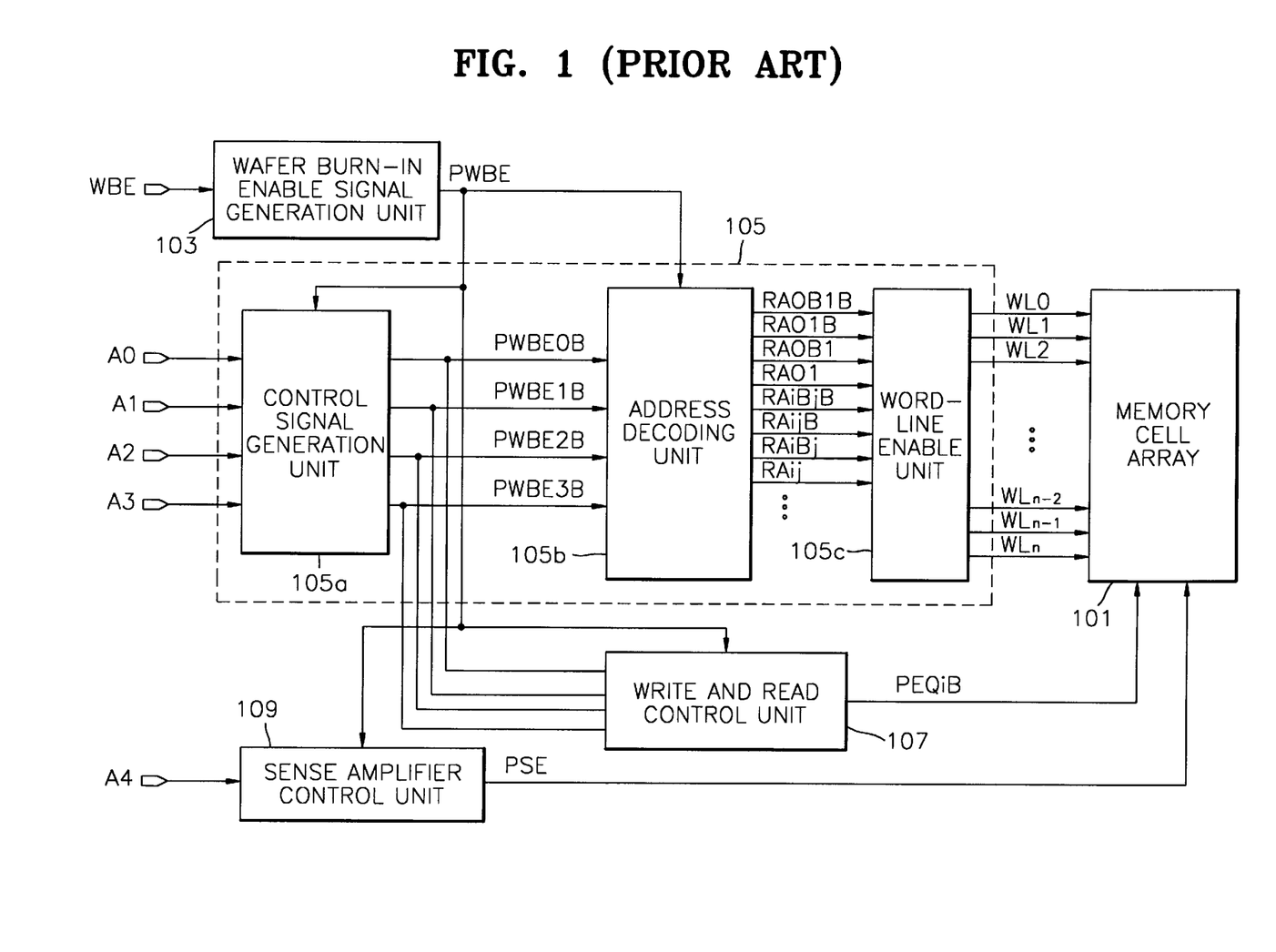
FIG. 1 is a block diagram of a conventional integrated circuit memory device having a wafer burn-in test capability.
Figure 2:
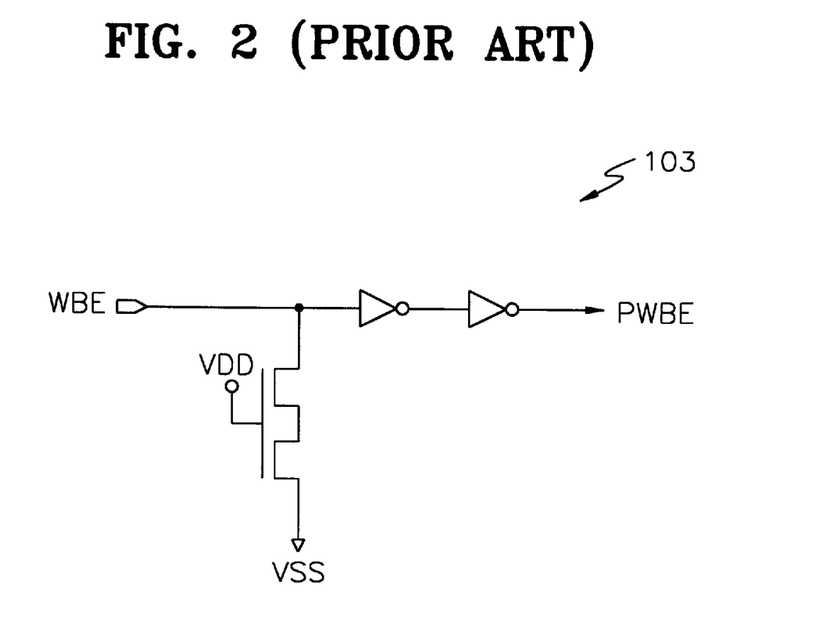
FIG. 2 is a circuit diagram of a wafer burn-in enable signal generation unit of FIG. 1.
Figure 3:
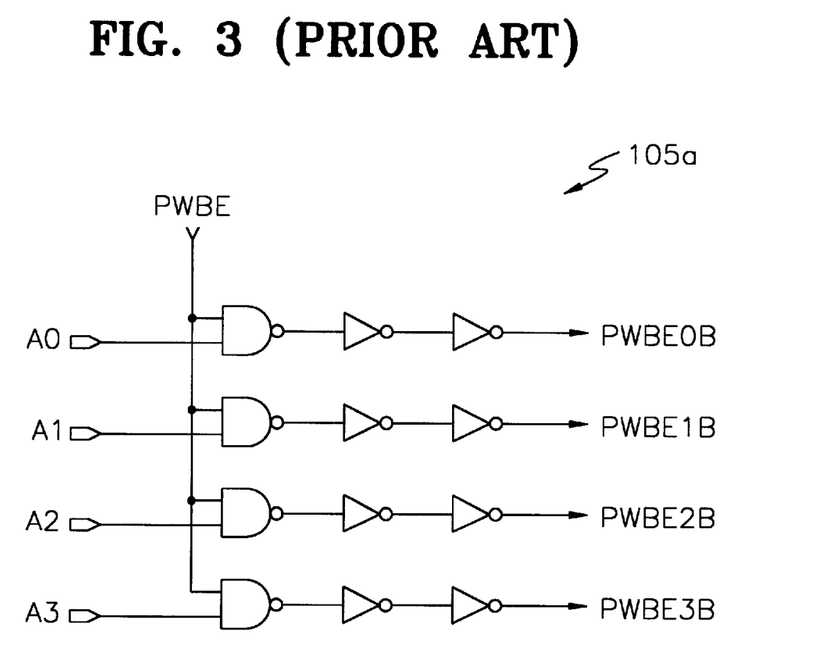
FIGS. 3 and 4 are circuit diagrams of a word line selection unit of FIG. 1.
Figure 4:
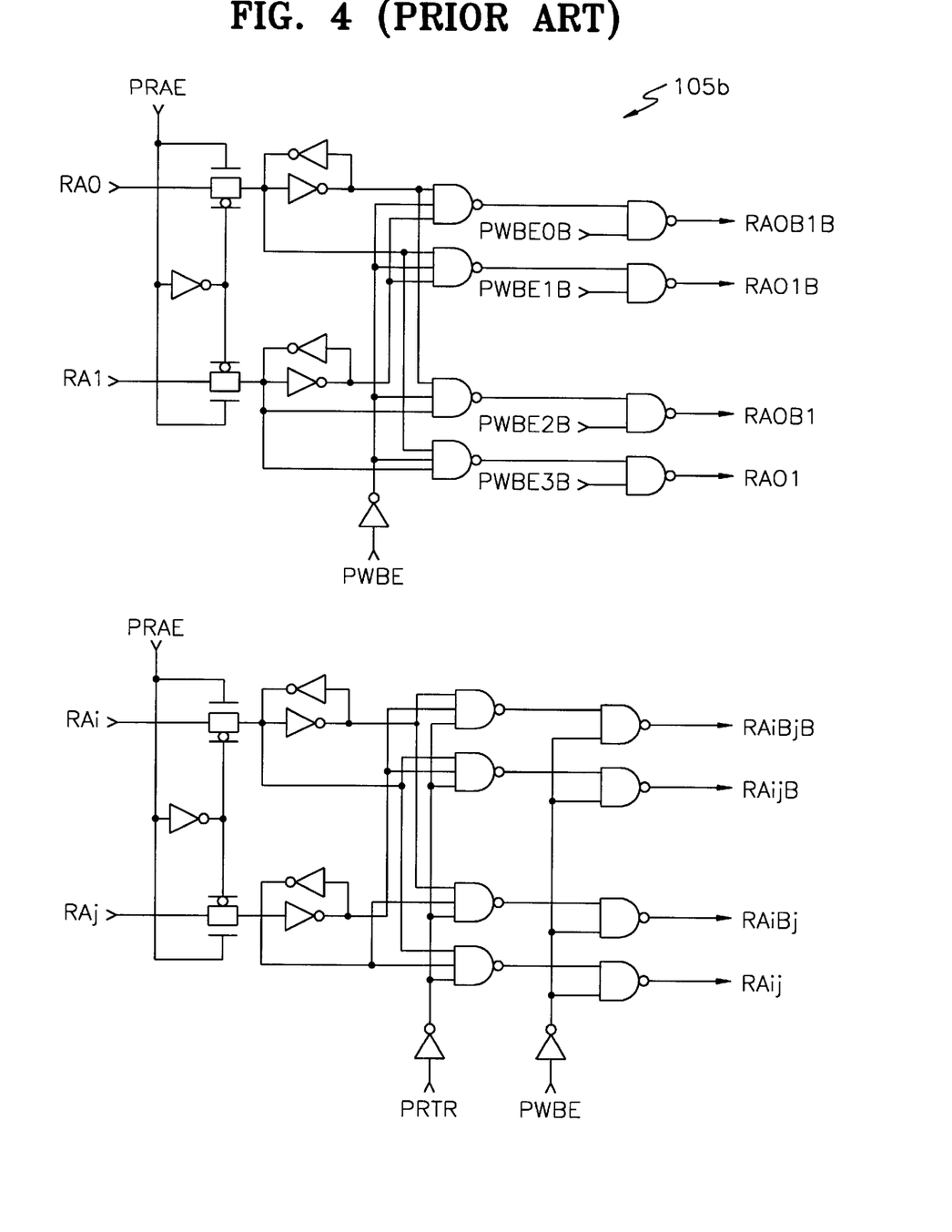
Figure 5:
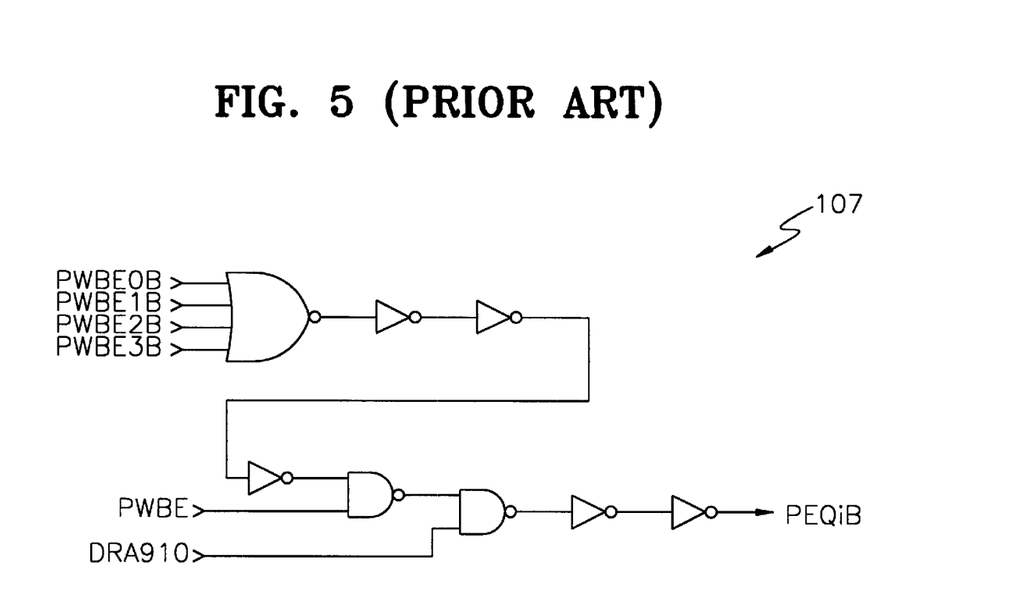
FIG. 5 is a circuit diagram of a write and read control unit of FIG. 1.
Figure 12:
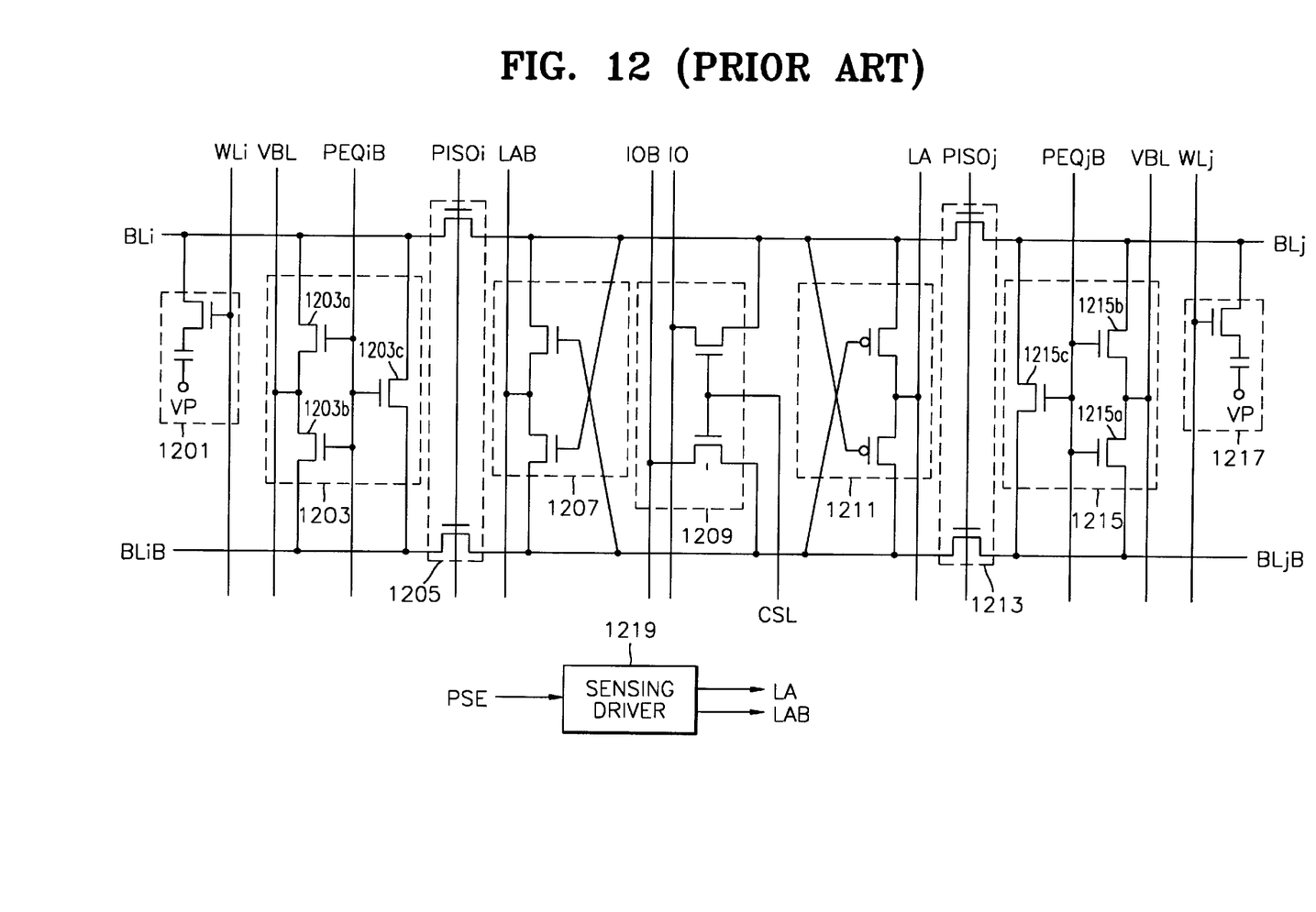
FIG. 12 is a circuit diagram of a conventional data sense circuit that can be used in the memory cell arrays of FIGS. 1 and 6.

FIG. 1 is a block diagram of a conventional integrated circuit memory device having a wafer burn-in test capability. With reference to FIG. 1, the integrated circuit memory device includes a memory cell array 101, a wafer burn-in enable signal generation unit 103, a word line selection unit 105, a write and read control unit 107, and a sense amplifier control unit 109. The word line selection unit 105 includes a control signal generation unit 105a, an address decoding unit 105b, and a word line enable unit 105c. The internal architectures of the aforementioned components are shown in detail in FIGS. 2–5. In particular, FIG. 2 is a circuit diagram of the wafer burn-in enable signal generation unit 103 of FIG. 1. FIGS. 3 and 4 are circuit diagrams of the control signal generation unit 105a of FIG. 1 and the address decoding unit 105b of FIG. 1 respectively. And FIG. 5 is a circuit diagram of the write and read control unit 107 of FIG. 1. In addition, FIG. 12 illustrates internal circuitry of the memory cell array 101. The internal details of these circuits are well known to those having skill in the art and need not be described further.

With reference to FIGS. 1–5 and 12, operations of a conventional integrated circuit memory device having a wafer burn-in test capability will be described hereafter. When a signal exhibiting a "high" logic value is applied to a pin WBE during a wafer burn-in test, the wafer burn-in enable signal generation unit 103 drives a wafer burn-in enable signal PWBE to a "high" logic value (see FIG. 2). While the wafer burn-in enable signal PWBE is driven "high," the word line selection unit 105 can selectively activate a plurality of word lines WL0 through WLn of the memory cell array 101 in response to signals applied to the four pins A0, A1, A2, and A3. More specifically, the control signal generation unit 105a generates control signals PWBE0B through PWBE3B, which correspond to the signals applied to the four pins A0, A1, A2, and A3 (see FIG. 3). In response to the control signals PWBE0B through PWBE3B, the address decoding unit 105b activates address signals selected from the address signals RA0B1B through RA01, which correspond to the word lines WL0 through WLn of the memory cell array 101. The word line enable unit 105c activates word lines selected from the word lines WL0 through WLn of the memory cell array 101 in response to the address signals RA0B1B through RAij. Inasmuch as the wafer burn-in enable signal PWBE is "high," the address signals RAiBjB through RAij, where i, j=2, 3, . . . , (i≠j) are driven to a "high" logic value.

For example, the following patterns of input signals can be applied to the control signal generation unit 105a to select various combinations of word lines for a wafer burn-in test. To activate even-numbered word lines selected from the word lines WL0 through WLn of the memory cell array 101, the pattern (1, 0, 1, 0) is applied to the four pins A0, A1, A2, and A3. As a result, the control signals PWBE0B through PWBE3B become (0, 1, 0, 1) so that the address signals RA0B1B through RA01 become (1, 0, 1, 0). To activate odd-numbered word lines selected from the word lines WL0 through WLn of the memory cell array 101, the pattern (0, 1, 0, 1) is applied to the four pins A0, A1, A2, and A3. As a result, the control signals PWBE0B through PWBE3B become (1, 0, 1, 0) so that the address signals RA0B1B through RA01 become (0, 1, 0, 1). To activate all of the word lines WL0 through WLn of the memory cell array 101, the pattern (1, 1, 1, 1) is applied to the four pins A0, A1, A2, and A3. As a result, the control signals PWBE0B through PWBE3B become (0, 0, 0, 0) so that the address signals RA0B1B through RA01 become (1, 1, 1, 1).

Thus, to activate either odd-numbered or even-numbered word lines selected from the word lines WL0 through WLn of the memory cell array 101 for a wafer burn-in test involving a write operation, two of the control signals PWBE0B through PWBE3B are driven to a "high" logic value. In addition, an output signal PEQiB (i.e., an operation control signal or equalization signal) of the write and read control unit 107 is also driven to a "high" logic value. Thus, referring now to FIG. 12, the equalization transistors 1203a, 1203b, and 1203c for equalizing a predetermined bit line pair of the memory cell array 101 are turned on and a voltage level VBL is written into a predetermined memory cell through the equalization transistors 1203a, 1204b, and 1203c.

To activate all of the word lines WL0 through WLn of the memory cell array 101 for a wafer burn-in test involving a write operation (i.e., to perform the write operation with respect to all memory cells), the control signals PWBE0B through PWBE3B are driven to a "low" logic value. Accordingly, the output signal PEQiB of the write and read control unit 107 is also driven to a "low" logic value (see FIG. 5). As a result, the equalization transistors 1203a, 1203b, and 1203c of FIG. 12 are turned off, which prevents the write operation from being performed on all of the memory cells.

To perform a wafer burn-in test involving a read operation, a signal exhibiting a "high" logic value is applied to a pin A4. In response thereto, the sense amplifier control unit 109 drives a sense amplifier enable signal PSE to a "high" logic value so that the sense amplifier of the memory cell array 101 (see, e.g., FIG. 12, sense amplifiers 1207 and 1211) is enabled to allow the read operation. In a conventional integrated circuit memory device having a wafer burn-in test capability, all of the word lines of the memory cell array 101 are typically activated to perform the read operation with respect to all memory cells. In other words, when a wafer burn-in test involving a read operation is performed, the pattern (1, 1, 1, 1) is applied to the four pins A0, A1, A2, and A3. As a result, the control signals PWBE0B through PWBE3B become (0, 0, 0, 0) so that the address signals RA0B1B through RA01 become (1, 1, 1, 1) to thereby activate all of the word lines WL0 through WLn. Inasmuch as the control signals PWBE0B through PWBE3B are at "low" logic values, the output signal PEQiB of the write and read control unit 107 is driven to a "low" logic value. Thus, the equalization transistors 1203a, 1203b, and 1203c of FIG. 12 are turned off to thereby allow the read operation.

Unfortunately, in a conventional integrated circuit memory device having a wafer burn-in test capability as described hereinabove, there may be a momentary interval during a wafer burn in test read operation in which the operation control signal or equalization signal PEQiB has not yet reached a "low" logic value. During this momentary interval the charge distribution of the memory cell may not be reliable when the word line is activated, which may cause the read operation to fail. Thus, a conventional integrated circuit memory device having a wafer burn-in test capability may be subject to the aforementioned race condition when performing a read operation because the read and write control unit 107 derives its inputs from the word line selection unit 105.

SUMMARY OF THE INVENTION

It is therefore an object of the present invention to provide improved integrated circuit memory devices having a wafer burn-in test capability.

It is another object of the present invention to provide improved integrated circuit memory devices that can allow a wafer burn-in test write operation to be performed on all memory cells of a memory cell array.

It is yet another object of the present invention to provide improved integrated circuit memory devices that can be less susceptible to race conditions in enabling a memory cell array for a read operation when performing a wafer burn-in test.

These and other objects, advantages, and features of the present invention may be provided by integrated circuit memory devices and methods of testing same in which a word line selection unit is used to generate address signals to selectively activate word lines of a memory cell array in response to a plurality of first input signals. In addition, a "write and read" control unit independently generates an operation control signal in response to a second input signal that is used to place the memory cell array into a "read mode" or a "write mode." Because the operation control signal is generated independent from the word line selection unit, a wafer burn-in test write operation can be performed on all memory cells of the memory cell array. Moreover, the independence of the "write and read" control unit can allow the memory cell array to be enabled for a read operation (i.e., switched to read mode) before initiating the read operation through the word line selection unit thereby avoiding any potential race condition.

In accordance with an aspect of the present invention, the memory cell array includes a sense amplifier, which is responsive to a sense amplifier control unit to turn the sense amplifier on or off depending on whether a read or a write operation is being performed on the memory cell array.

In accordance with another aspect of the present invention, the word line selection unit includes a control signal generation unit that generates a plurality of control signals in response to the first plurality of input signals, an address decoding unit that selectively activates the address signals in response to the plurality of control signals, and a word line enable unit that selectively activates the word lines in response to the address signals.

In accordance with yet another aspect of the present invention, the plurality of control signals include a first control signal for selecting even-numbered word lines of the memory cell array, a second control signal for selecting odd-numbered word lines of the memory cell array, a third control signal for selecting word lines corresponding to complementary cells of the memory cell array, a fourth control signal for selecting word lines corresponding to true cells of the memory cell array, and a fifth control signal for selecting all of the plurality of word lines.

Thus, integrated circuit memory devices having a wafer burn-in test capability and related testing methods in accordance with the present invention can allow a wafer burn-in test write operation to be performed on all memory cells of a memory cell array and reduce the susceptibility of wafer burn-in test read operations to a race condition when enabling the memory cell array for the read operations.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

Figure 6:
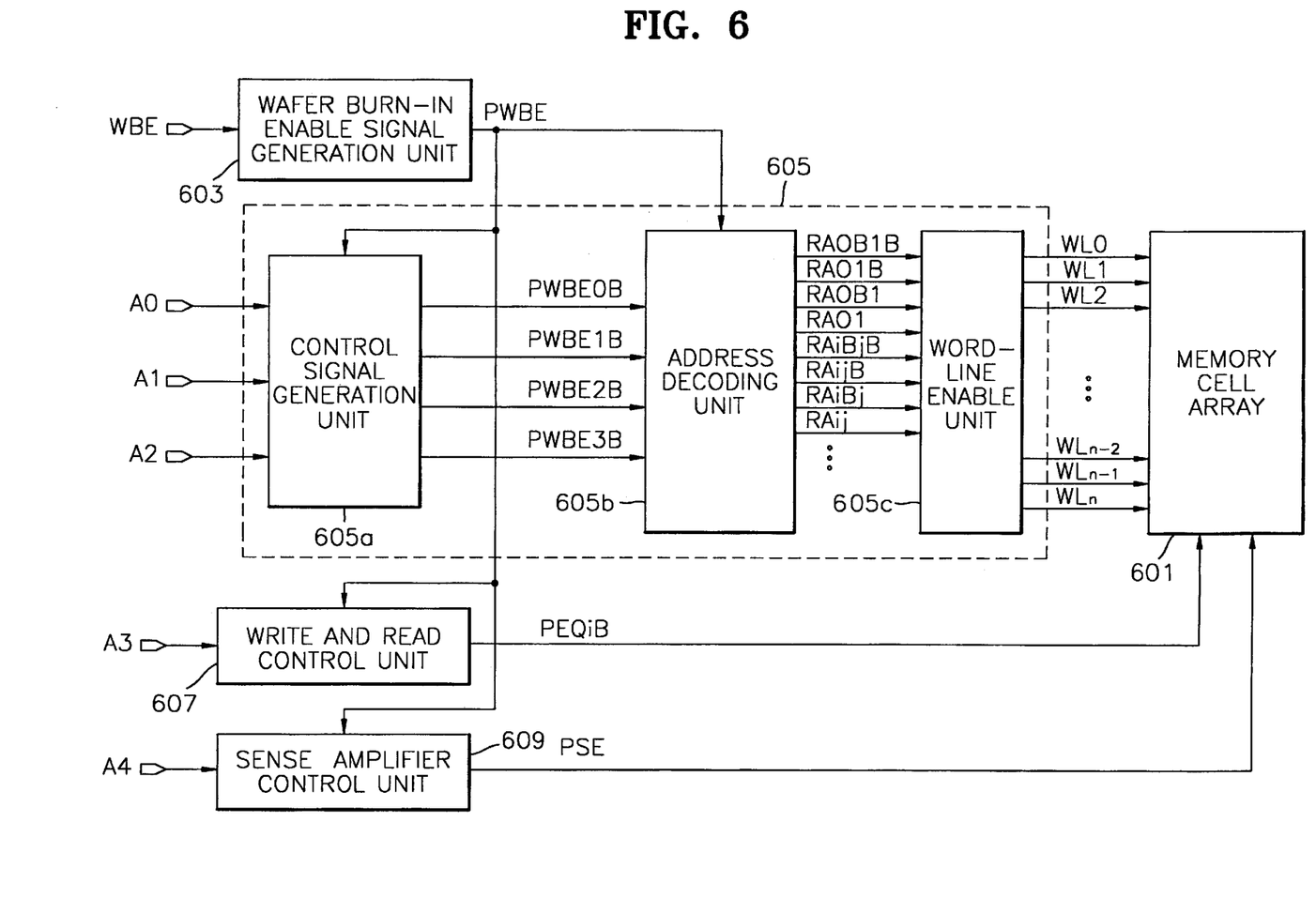
FIG. 6 is a circuit diagram of an integrated circuit memory device having a wafer burn-in test capability in accordance with a preferred embodiment of the present invention.

With reference to FIG. 6, an integrated circuit memory device having a wafer burn-in test capability according to the present invention includes a memory cell array 601, a wafer burn-in enable signal generation unit 603, a word line selection unit 605, a "write and read" control unit 607, and a sense amplifier control unit 609.

When performing a wafer burn-in test, the wafer burn-in enable signal generation unit 603 generates a wafer burn-in enable signal PWBE in response to a signal applied to a pin WBE. The word line selection unit 605 logically combines input signals applied to the three pins A0, A1, and A2 to selectively activate a plurality of word lines WL0 through WLn of the memory cell array 601. The "write and read" control unit 607 is used to control whether the memory cell array 601 can be accessed via a write operation or a read operation. That is, the "write and read" control unit 607 can be used to place the memory cell array into a "write mode" or a "read mode." The "write and read" control unit 607 is responsive to an input signal applied to a fourth pin A3. The sense amplifier control unit 609 enables or disables the sense amplifier (see, e.g., FIG. 12, sense amplifiers 1207 and 1211) of the memory cell array 601 in response to an input signal applied to a fifth pin A4. It will be understood that as used herein the term "pin" includes any signal input/output source such as pads.

The word line selection unit 605 includes a control signal generation unit 605a, an address decoding unit 605b, and a word line enable unit 605c. The control signal generation unit 605a logically combines the input signals applied to the first through third pins A0, A1, and A2 to generate control signals PWBE0B through PWBE3B. In response to the control signals PWBE0B through PWBE3B, the address decoding unit 605b activates address signals selected from the address signals RA0B1B through RA01 and RAiBjB through RAij, where i, j=2, 3, . . . , (i≠j) corresponding to the word lines WL0 through WLn of the memory cell array 601. The word line enable unit 605c activates word lines selected from the word lines WL0 through WLn of the memory cell array 601 in response to the address signals RA0B1B through RAij.

Figure 7:
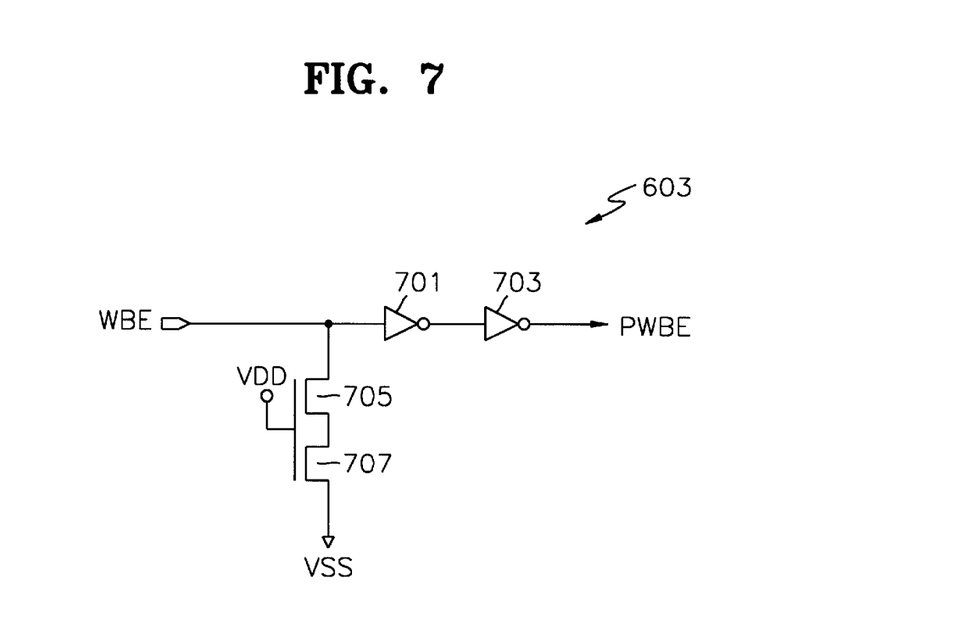
FIG. 7 is a circuit diagram of a wafer burn-in enable signal generation unit of FIG. 6.

With reference to FIG. 7, the wafer burn-in enable signal generation unit 603, in accordance with a preferred embodiment thereof, includes inverters 701 and 703, and pull-down transistors 705 and 707 configured as shown. Note that the pin WBE and wafer burn-in enable signal PVBE are also shown in FIG. 6. During the performance of a wafer burn-in test, the wafer burn-in enable signal generation unit 603 drives the wafer burn-in enable signal PWBE to a "high" logic value when a signal exhibiting a "high" logic value is applied to the pin WBE. It should be understood that the internal architecture of the wafer burn-in enable signal generation unit 603, which is illustrated in FIG. 7, is exemplary of a preferred embodiment. Alternative embodiments of the wafer burn-in enable signal generation unit 603 may comprise additional or alternative logic gates.

Figure 8:
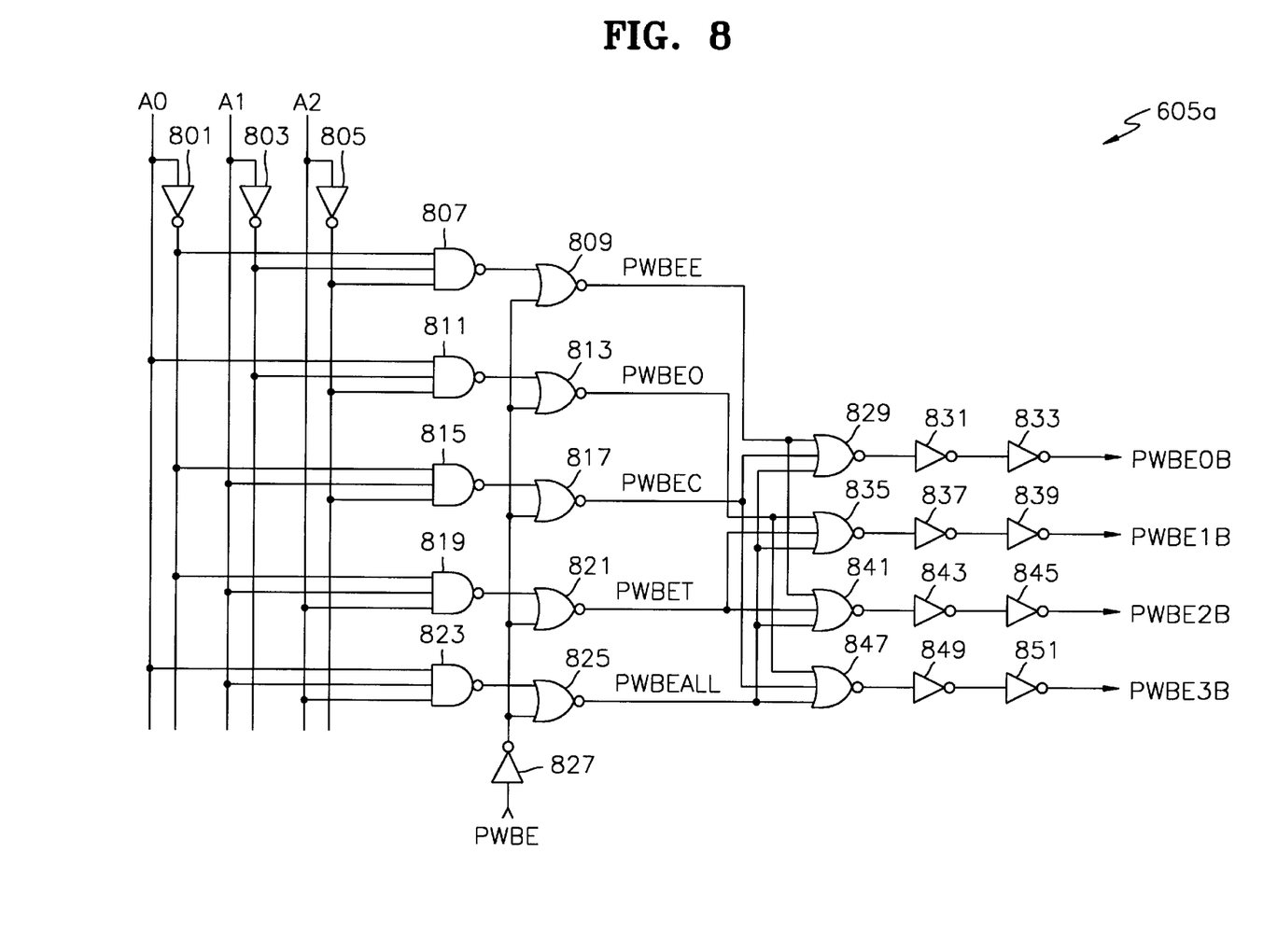
FIG. 8 is a circuit diagram of a control signal generation unit of FIG. 6.

With reference to FIG. 8, the control signal generation unit 605a, in accordance with a preferred embodiment thereof, includes inverters 801, 803, 805, 827, 831, 833, 837, 839, 843, 845, 849, and 851, NAND gates 807, 811, 815, 819, and 823, and NOR gates 809, 813, 817, 821, 825, 829, 835, 841, and 847 configured as shown. Reference characters A0, A1 and A2 correspond to the three pins A0, A1 and A2 of FIG. 6. Reference character PWBEE identifies a control signal for selecting even-numbered word lines WL0, WL2, . . . of the memory cell array 601. Reference character PWBEO identifies a control signal for selecting odd-numbered word lines WL1, WL3, . . . of the memory cell array 601. Reference character PWBEC identifies a control signal for selecting word lines WL0, WL3, . . . of the memory cell array 601 corresponding to complementary cells. Reference character PWBET identifies a control signal for selecting word lines WL1, WL2, . . . of the memory cell array 601 corresponding to true cells. Word lines connected to the complementary cells and the true cells may be changed in various ways. And reference character PWBEALL identifies a control signal for selecting all word lines WL0 through WLn of the memory cell array 601. Note that the output control signals PWBE0B through PWBE3B of the control signal generation unit 605a are also shown in FIG. 6. It should be understood that the internal architecture of the control signal generation unit 605a, which is illustrated in FIG. 8, is exemplary of a preferred embodiment. Alternative embodiments of the control signal generation unit 605a may comprise additional or alternative logic gates.

Figure 9:
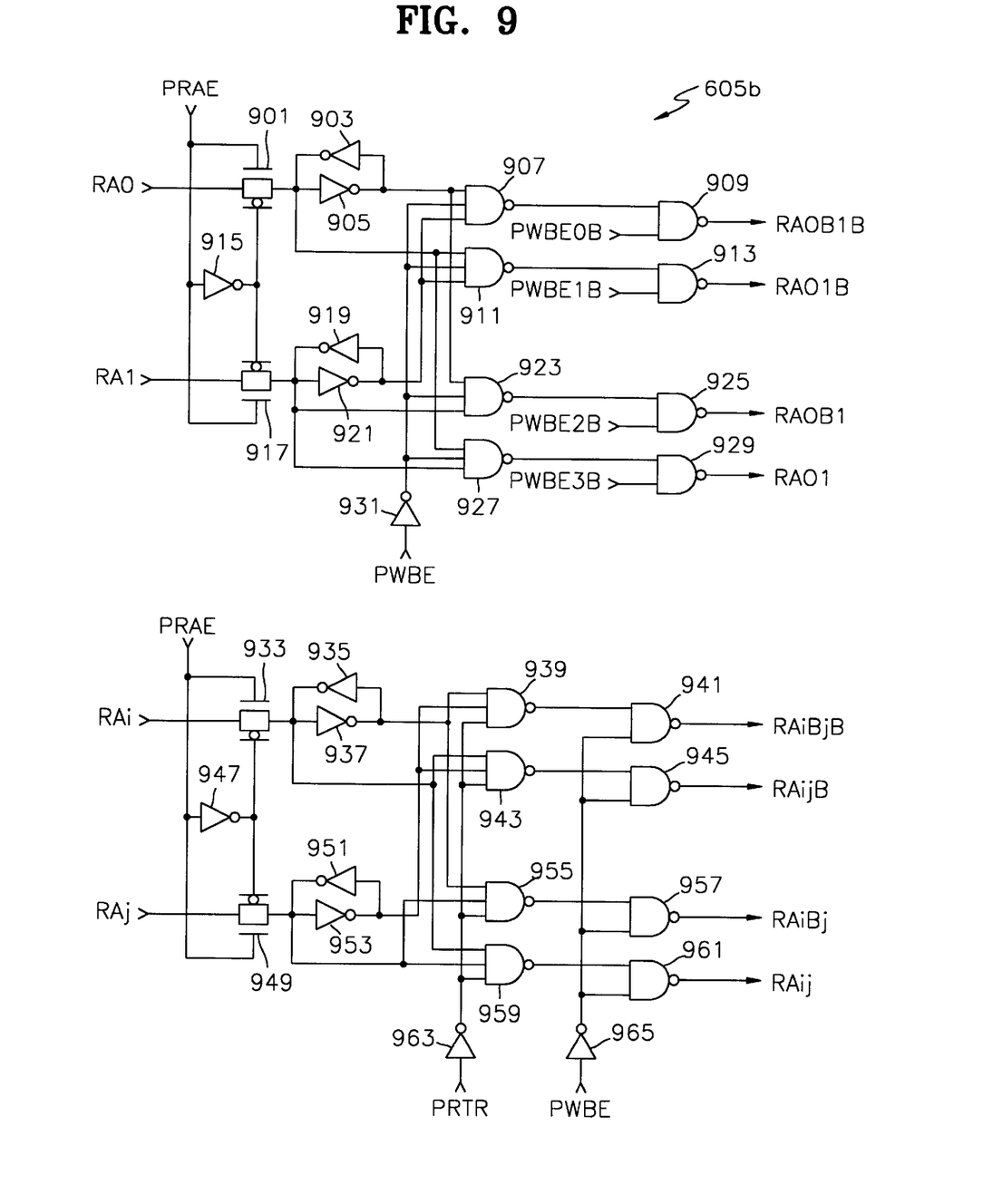
FIG. 9 is a circuit diagram of an address decoding unit of FIG. 6.

With reference to FIG. 9, the address decoding unit 605b, in accordance with a preferred embodiment thereof, includes transfer gates 901, 917, 933 and 949, inverters 903, 905, 915, 919, 921, 931, 935, 937, 947, 951, 953, 963, and 965, and NAND gates 907, 909, 911, 913, 923, 925, 927, 929, 939, 941, 943, 945, 955, 957, 959, and 961 configured as shown. Note that the control signals PWBE0B through PWBE3B are also shown in FIGS. 6 and 8 and the address signals RA0B1B through RA01 and RAiBjB through RAij, where i, j=2, 3, . . . , (i≠j) are also shown in FIG. 6. The reference characters RA0, RA1, RAi, and RAj, where i, j=2, 3, . . . , (i≠j) correspond to address bits that are applied externally to the integrated circuit memory device of FIG. 6 during normal operation. In addition, reference characters PRAE and PRTR identify additional signals that are used by the integrated circuit memory device of FIG. 6 during normal operation. It should be understood that the internal architecture of the address decoding unit 605b, which is illustrated in FIG. 9, is exemplary of a preferred embodiment. Alternative embodiments of the address decoding unit 605b may comprise additional or alternative logic gates.

Figure 10:
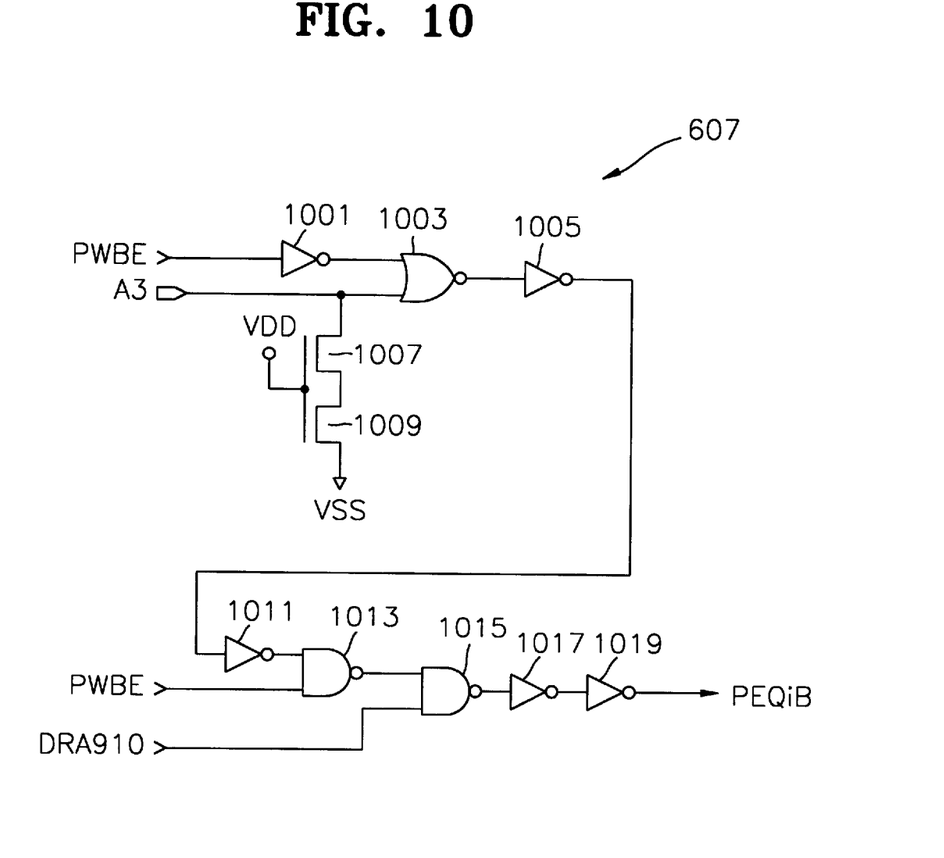
FIG. 10 is a circuit diagram of a "write and read" control unit of FIG. 6.

With reference to FIG. 10, the "write and read" control unit 607, in accordance with a preferred embodiment thereof, includes inverters 1001, 1005, 1011, 1017, and 1019, a NOR gate 1003, NAND gates 1013 and 1015, and pull-down transistors 1007 and 1009. Reference character A3 corresponds to the fourth pin A3 shown in FIG. 6. The output signal PEQiB (i.e., the operation control signal or equalization signal) is also shown in FIG. 6. Reference character DRA910 identifies a signal that is used by the integrated circuit memory device of FIG. 6 during normal operation. It should be understood that the internal architecture of the "write and read" control unit 607, which is illustrated in FIG. 10, is exemplary of a preferred embodiment. Alternative embodiments of the "write and read" control unit 607 may comprise additional or alternative logic gates.

Figure 11:
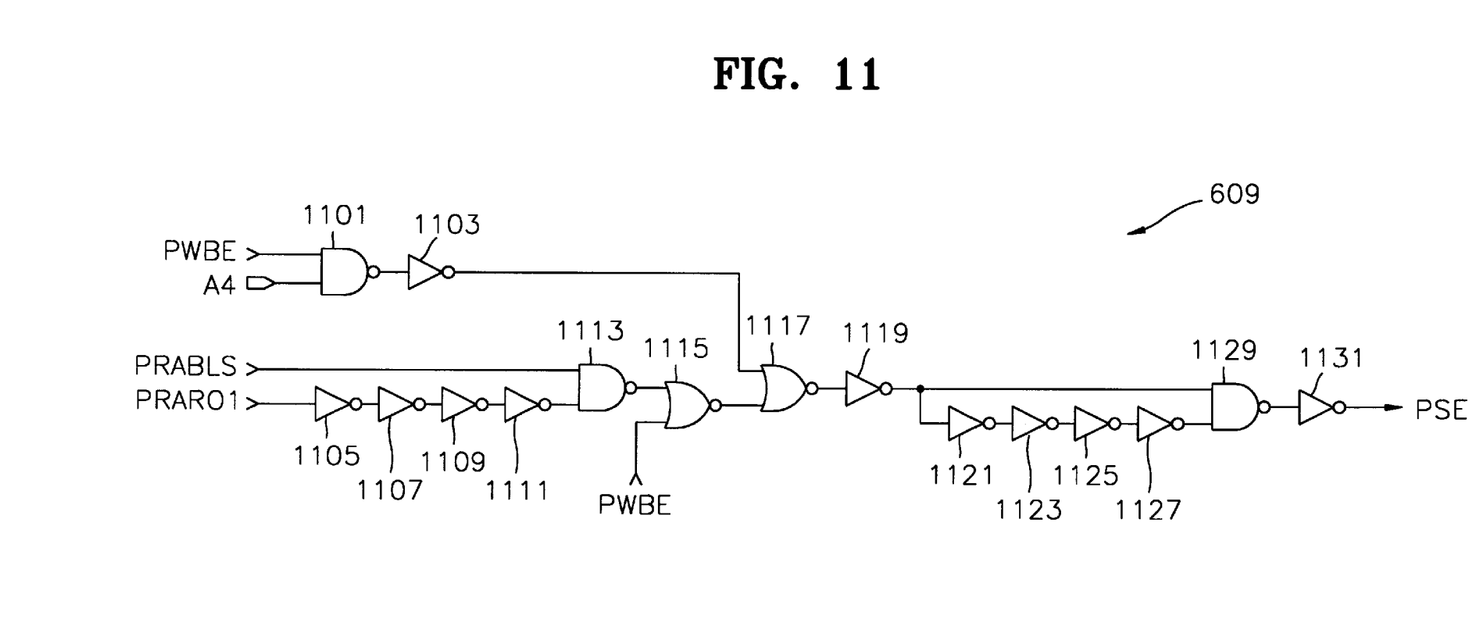
FIG. 11 is a circuit diagram of a sense amplifier control unit of FIG. 6.

With reference to FIG. 11, the sense amplifier control unit 609, in accordance with a preferred embodiment thereof, includes inverters 1103, 1105, 1107, 1109, 1111, 1119, 1121, 1123, 1125, 1127, and 1131, NOR gates 1115 and 1117, and NAND gates 1101, 1113, and 1129. Reference numeral A4 corresponds to the fifth pin A4 shown in FIG. 6. The reference character PSE identifies a sense amplifier enable signal, which is also shown in FIG. 6. The reference characters PRABLS and PRAR01 identify signals that are used by the integrated circuit memory device of FIG. 6 during normal operation. It should be understood that the internal architecture of the sense amplifier control unit 609, which is illustrated in FIG. 11, is exemplary of a preferred embodiment. Alternative embodiments of the sense amplifier control unit 609 may comprise additional or alternative logic gates.

With reference to FIG. 12, a conventional data sense circuit is shown that can be used in the memory cell array 601 and includes memory cells 1201 and 1217, bit line pairs BLi, BLiB, BLj, and BLjB, equalization circuits 1203 and 1215, isolators 1205 and 1213, sense amplifiers 1207 and 1211, and a column selection unit 1209.

With reference to FIGS. 6–12, operations of an integrated circuit memory device having a wafer burn-in test capability in accordance with the present invention will be described hereafter. When a signal exhibiting a "high" logic value is applied to the pin WBE during a wafer burn-in test, the wafer burn-in enable signal generation unit 603 drives the wafer burn-in enable signal PWBE to a "high" logic value. While the wafer burn-in enable signal PWBE is driven "high," the word line selection unit 605 can selectively activate a plurality of word lines WL0 through WLn of the memory cell array 601 in response to signals applied to the three pins A0, A1, and A2.

For example, the following patterns of input signals can be applied to the control signal generation unit 605a to select various combinations of word lines for a wafer burn-in test.

To activate even-numbered word lines selected from the word lines WL0 through WLn of the memory cell array 601 for a write operation, the pattern (0, 0, 0) is applied to the three pins A0, A1, and A2. As a result, the control signals PWBEE, PWBEO, PWBEC, PWBET and PWBEALL become (1, 0, 0, 0, 0), which causes the control signals PWBE0B through PWBE3B to become (0, 1, 0, 1), and finally the address signals RA0B1B through RA01 to become (1, 0, 1, 0) (see FIGS. 8 and 9).

To activate odd-numbered word lines selected from the word lines WL0 through WLn of the memory cell array 601 for a write operation, the pattern (1, 0, 0) is applied to the three pins A0, A1, and A2. As a result, the control signals PWBEE, PWBEO, PWBEC, PWBET and PWBEALL become (0, 1, 0, 0, 0), which causes the control signals PWBE0B through PWBE3B to become (1, 0, 1, 0), and finally the address signals RA0B1B through RA01 to become (0, 1, 0, 1) (see FIGS. 8 and 9).

To activate word lines selected from the word lines WL0 through WLn of the memory cell array 601 corresponding to complementary cells for a write operation, the pattern (0, 1, 0) is applied to the three pins A0, A1, and A2. As a result, the control signals PWBEE, PWBEO, PWBEC, PWBET and PWBEALL become (0, 0, 1, 0, 0), which causes the control signals PWBE0B through PWBE3B to become (0, 1, 1, 0), and finally the address signals RA0B1B through RA01 to become (1, 0, 0, 1) (see FIGS. 8 and 9).

To activate word lines selected from the word lines WL0 through WLn of the memory cell array 601 corresponding to the cells for a write operation, the pattern (0, 1, 1) is applied to the three pins A0, A1, and A2. As a result, the control signals PWBEE, PWBEO, PWBEC, PWBET and PWBEALL become (0, 0, 0, 1, 0), which causes the control signals PWBE0B through PWBE3B to become (1, 0, 0, 1), and finally the address signals RA0B1B through RA01 to become (0, 1, 1, 0) (see FIGS. 8 and 9).

To activate all word lines WL0 through WLn of the memory cell array 601 for a write operation (i.e., to perform the write operation with respect to all memory cells), the pattern (1, 1, 1) is applied to the three pins A0, A1, and A2. As a result, the control signals PWBEE, PWBEO, PWBEC, PWBET and PWBEALL become (0, 0, 0, 0, 1), which causes the control signals PWBE0B through PWBE3B to become (0, 0, 0, 0), and finally the address signals RA0B1B through RA01 to become (1, 1, 1, 1) (see FIGS. 8 and 9).

Meanwhile, to perform a write operation during the wafer burn-in test, a signal exhibiting a "low" logic value (i.e., logic value 0) is applied to the "write and read" control unit 607 through the fourth pin A3. Alternatively, the fourth pin A3 could be allowed to float to a "low" logic value. In response to the "low" logic value applied to the fourth pin A3, the "write and read" control unit 607 drives the operation control signal or equalization signal PEQiB to a "high" logic value (see FIG. 10). Thus, referring now to FIG. 12, the equalization transistors 1203a, 1203b, and 1203c of the equalization circuit 1203 are turned on, and a voltage level VBL is written into a predetermined memory cell connected to the activated word line through the equalization transistors.

Advantageously, an integrated circuit memory device having a wafer burn-in test capability according to the present invention can allow a wafer burn-in test write operation to be performed on all memory cells. Unlike conventional integrated circuit memory devices that facilitate wafer burn-in testing, the present invention uses an independent signal as an input to the "write and read" control unit 607 rather than using control signals from the word line selection unit 605. As a result, the operation control signal or equalization signal PEQiB can be independently driven to a "high" logic value during the write operation to ensure that the equalization transistors 1203a, 1203b, and 1203c (see FIG. 12) are turned on.

To perform a read operation as part of a wafer burn-in test, a signal exhibiting a "high" logic value is applied to both the fourth pin A3 and the fifth pin A4. In response thereto, the "write and read" control unit 607 drives the operation control signal or equalization signal PEQiB to a "low" logic value (see FIG. 10) and the sense amplifier control unit 609 drives the sense amplifier enable signal PSE to a "high" logic value (see FIG. 11). Thus, the equalization transistors 1203a, 1203b, and 1203c of the equalization circuit 1203 of FIG. 12 are turned off and the sense amplifiers 1207 and 1211 of FIG. 12 are enabled through a sense driver 1219. As a result, the memory cell array 601 can now be accessed via a read operation.

The read operation is typically performed with respect to all memory cells. That is, word lines WL0 through WLn of the memory cell array 601 are activated, to thereby perform the read operation with respect to all cells. To perform a read operation during a wafer burn-in test, the pattern (1, 1, 1) is applied to the three pins A0, A1, and A2, to activate all word lines WL0 through WLn of the memory cell array 601. As a result, the control signals PWBEE, PWBEO, PWBEC, PWBET and PWBEALL become (0, 0, 0, 0, 1), which causes the control signals PWBE0B through PWBE3B to become (0, 0, 0, 0), and finally the address signals RA0B1B through RA01 to become (1, 1, 1, 1) (see FIGS. 8 and 9).

Thus, an integrated circuit memory device having a wafer burn-in test capability according to the present invention can improve the reliability of a wafer burn-in test read operation because the operation control signal or equalization signal PEQiB, which is used to turn off the equalization transistors during a read operation, can be controlled independently from the word line selection unit 605. As a result, the race condition that may develop when the "write and read" control unit 607 uses control signals from the word line selection unit 605 as an input for controlling the operation control signal or equalization signal PEQiB can be avoided.

In concluding the detailed description, it should be noted that many variations and modifications can be made to the preferred embodiment without substantially departing from the principles of the present invention. All such variations and modifications are intended to be included herein within the scope of the present invention, as set forth in the following claims.

I claim:

1. An integrated circuit memory device, comprising:
    a plurality of equalization circuits;
    a memory cell array having a plurality of word lines and a plurality of bit line pairs, a respective one of the plurality of bit line pairs having a respective one of the plurality of equalization circuits electrically connected thereto;
    a word line selection unit that selectively activates the plurality of word lines in response to a plurality of first input signals; and
    a write and read control unit that generates an operation control signal in response to a second input signal, the write and read control unit and the second input signal being independent of the word line selection unit and the plurality of equalization circuits being responsive to the operation control signal such that the memory cell array is accessible for one of a write operation and a read operation.

2. An integrated circuit memory device as recited in claim 1, wherein the memory cell array further comprises a sense amplifier.

3. An integrated circuit memory device as recited in claim 2, further comprising:
    a sense amplifier control unit that generates a sense amplifier enable signal in response to a third input signal, the sense amplifier being responsive to the sense amplifier enable signal.

4. An integrated circuit memory device as recited in claim 1, wherein the word line selection unit comprises:
    a control signal generation unit that generates a plurality of control signals in response to the plurality of first input signals;
    an address decoding unit that selectively activates address signals in response to the plurality of control signals; and
    a word line enable unit that selectively activates the plurality of word lines in response to the address signals.

5. An integrated circuit memory device as recited in claim 4, wherein the plurality of first input signals are input through a plurality of input pins and a number of the first input signals is less than a number of the control signals.

6. An integrated circuit memory device as recited in claim 4, wherein the plurality of control signals comprise:
    a first control signal for selecting even-numbered word lines from the plurality of word lines;
    a second control signal for selecting odd-numbered word lines from the plurality of word lines;
    a third control signal for selecting word lines corresponding to complementary cells from the plurality of word lines;
    a fourth control signal for selecting word lines corresponding to true cells from the plurality of word lines; and
    a fifth control signal for selecting all of the plurality of word lines.

7. An integrated circuit memory device, comprising:
    a memory cell array having a plurality of word lines;
    a word line selection unit that selectively activates the plurality of word lines in response to a plurality of first input signals, the word line selection unit comprising:
        a control signal generation unit that generates a plurality of control signals in response to the plurality of first input signals;
        an address decoding unit that selectively activates address signals in response to the plurality of control signals; and
        a word line enable unit that selectively activates the plurality of word lines in response to the address signals; and
    a write and read control unit that generates an operation control signal in response to a second input signal, the write and read control unit and the second input signal being independent of the word line selection unit and the memory cell array being responsive to the operation control signal such that the memory cell array is accessible for one of a write operation and a read operation.

8. An integrated circuit memory device as recited in claim 7, wherein the memory cell array further comprises a sense amplifier.

9. An integrated circuit memory device as recited in claim 8, further comprising:
    a sense amplifier control unit that generates a sense amplifier enable signal in response to a third input signal, the sense amplifier being responsive to the sense amplifier enable signal.

10. An integrated circuit memory device as recited in claim 7, wherein the plurality of first input signals are input through a plurality of input pins and a number of the first input signals is less than a number of the control signals.

11. An integrated circuit memory device as recited in claim 7, wherein the plurality of control signals comprise:
    a first control signal for selecting even-numbered word lines from the plurality of word lines;
    a second control signal for selecting odd-numbered word lines from the plurality of word lines;
    a third control signal for selecting word lines corresponding to complementary cells from the plurality of word lines;
    a fourth control signal for selecting word lines corresponding to true cells from the plurality of word lines; and
    a fifth control signal for selecting all of the plurality of word lines.

12. A method of performing a wafer burn-in test on an integrated circuit memory device comprising a memory cell array having a plurality of word lines, comprising the steps of:
    selectively activating the plurality of word lines in response to a plurality of first input signals, the step of selectively activating the plurality of word lines comprising the steps of:

generating a plurality of control signals in response to the plurality of first input signals;

selectively activating a plurality of address signals in response to the plurality of control signals; and selectively activating the plurality of word lines in response to the plurality of address signals; and placing the memory cell array into one of a read state and a write state in response to a second input signal that is independent of the step of selectively activating the plurality of word lines in response to a plurality of first input signals.

13. A method as recited in claim 12, wherein the memory cell array further comprises a sense amplifier and the method further comprises the step of:

controlling operation of the sense amplifier in response to a third input signal.

14. A method as recited in claim 12, wherein the plurality of first input signals are input through a plurality of input pins and a number of the first input signals is less than a number of the control signals.

15. A method as recited in claim 12, wherein the plurality of control signals comprise:

a first control signal for selecting even-numbered word lines from the plurality of word lines;

a second control signal for selecting odd-numbered word lines from the plurality of word lines;

a third control signal for selecting word lines corresponding to complementary cells from the plurality of word lines;

a fourth control signal for selecting word lines corresponding to true cells from the plurality of word lines; and a fifth control signal for selecting all of the plurality of word lines.

16. An integrated circuit memory device, comprising:

a memory cell array having a plurality of word lines;

a word line selection unit that selectively activates the plurality of word lines in response to a plurality of first input signals, the word line selection unit comprising:

a control signal generation unit that generates a plurality of control signals in response to the plurality of first input signals;

an address decoding unit that selectively activates address signals in response to the plurality of control signals; and a word line enable unit that selectively activates the plurality of word lines in response to the address signals; and a write and read control unit that places the memory cell array into one of a read state and a write state in response to a second input signal that is independent of the word line selection unit.

17. An integrated circuit memory device as recited in claim 16, wherein the memory cell array further comprises a sense amplifier.

18. An integrated circuit memory device as recited claim 17, further comprising:

a sense amplifier control unit that generates a sense amplifier enable signal in response to a third input signal, the sense amplifier being responsive to the sense amplifier enable signal.

19. An integrated circuit memory device as recited in claim 16, wherein the plurality of first input signals are input through a plurality of input pins and a number of the first input signals is less than a number of the control signals.

20. An integrated circuit memory device, comprising:

a memory cell array having a plurality of word lines;

means, responsive to a plurality of first input signals, for selectively activating the plurality of word lines, the means for selectively activating comprising:

means, responsive to the plurality of first input signals, for generating a plurality of control signals;

means, responsive to the plurality of control signals, for selectively activating a plurality of address signals; and means, responsive to the plurality of address signals, for selectively activating the plurality of word lines; and means, responsive to a second input signal, for placing the memory cell array into one of a read state and a write state that is independent of the means for selectively activating.

21. An integrated circuit memory device as recited in claim 20, wherein the memory cell array further comprises a sense amplifier.

22. An integrated circuit memory device as recited in claim 21, further comprising:

means, responsive to a third input signal, for controlling operation of the sense amplifier.

23. An integrated circuit memory device, comprising:

a plurality of equalization circuits that are responsive to an equalization signal;

a memory cell array having a plurality of word lines and a plurality of bit line pairs, a respective one of the plurality of bit line pairs having a respective one of the plurality of equalization circuits electrically connected thereto;

a word line selection unit that selectively activates the plurality of word lines in response to a plurality of first input signals; and a write and read control unit that generates the equalization signal and is responsive to a second input signal and a burn in test enable signal, the second input signal and the burn in test enable signal being independent of the word line selection unit.

24. A method of performing a wafer burn-in on an integrated circuit memory device comprising a plurality of equalization circuits and a memory cell array having a plurality of word lines and a plurality of bit line pairs, a respective one of the plurality of bit line pairs having a respective one of the plurality of equalization circuits electrically connected thereto, comprising the steps of:

selectively activating the plurality of word lines in response to a plurality of first input signals, the step of selectively activating the plurality of word lines comprising the steps of:

generating a plurality of control signals in response to the plurality of first input signals;

selectively activating a plurality of address signals in response to the plurality of control signals; and selectively activating the plurality of word lines in response to the plurality of address signals; and controlling operation of the plurality of equalization circuits to place the memory cell array into one of a read state and a write state in response to a second input signal, the second input signal being independent of the step of selectively activating the plurality of word lines.

25. A method as recited in claim 24, wherein the plurality of first input signals are input through a plurality of input pins and a number of the first input signals is less than a number of the signals.

26. A method as recited in claim 24, wherein the plurality of control signals comprise:
   a first control signal for selecting even-numbered word lines from the plurality of word lines;
   a second control signal for selecting odd-numbered word lines from the plurality of word lines;
   a third control signal for selecting word lines corresponding to complementary cells from the plurality of word lines;
   a fourth control signal for selecting word lines corresponding to true cells from the plurality of word lines; and
   a fifth control signal for selecting all of the plurality of word lines.

27. An integrated circuit memory device, comprising:
   a plurality of equalization circuits;
   a memory cell array having a plurality of word lines and a plurality of bit line pairs, a respective one of the plurality of bit line pairs having a respective one of the plurality of equalization circuits electrically connected thereto;
   a word line selection unit that selectively activates the plurality of word lines in response to a plurality of first input signals, the word line selection unit comprising:
      a control signal generation unit that generates a plurality of control signals in response to the plurality of first input signals;
      an address decoding unit that selectively activates address signals in response to the plurality of control signals; and
      a word line enable unit that selectively activates the plurality of word lines in response to the address signals; and
   a write and read control unit that cooperates with the plurality of equalization circuits to place the memory cell array into one of a read state and a write state in response to a second input signal that is independent of the word line selection unit.

28. An integrated circuit memory device as recited in claim 27, wherein the plurality of first input signals are input through a plurality of input pins and a number of the first input signals is less than a number of the control signals.

29. An integrated circuit memory device, comprising:
   a plurality of equalization circuits;
   a memory cell array having a plurality of word lines and a plurality of bit line pairs, a respective one of the plurality of bit line pairs having a respective one of the plurality of equalization circuits electrically connected thereto;
   means, responsive to a plurality of first input signals, for selectively activating the plurality of word lines, the means for selectively activating comprising:
      means, responsive to the plurality of first input signals, for generating a plurality of control signals;
      means, responsive to the plurality of control signals, for selectively activating a plurality of address signals; and
      means, responsive to the plurality of address signals, for selectively activating the plurality of word lines; and
   means, responsive to a second input signal, for controlling operation of the plurality of equalization circuits to place the memory cell array into one of a read state and a write state, the means for controlling operation of the plurality of equalization circuits being independent of the means for selectively activating the plurality of word lines.

* * * * *